(12) United States Patent
Omoumi et al.

(10) Patent No.: US 11,038,362 B1
(45) Date of Patent: Jun. 15, 2021

(54) SELF-CONTAINED POWER SIGNAL GENERATION SYSTEM FOR ELECTRICITY METER TESTING

(71) Applicant: Technology for Energy Corporation, Knoxville, TN (US)

(72) Inventors: Kevin Christopher Omoumi, Cookeville, TN (US); Allen Vaughn Blalock, Louisville, TN (US); Kai Bouse, Loudon, TN (US); Robert Stephen Hudson, Lenior City, TN (US)

(73) Assignee: Technology for Energy Corporation, Knoxville, TN (US)

( * ) Notice: Subject to any disclaimer, the term of this patent is extended or adjusted under 35 U.S.C. 154(b) by 186 days.

(21) Appl. No.: 16/148,997

(22) Filed: Oct. 1, 2018

Related U.S. Application Data

(60) Provisional application No. 62/565,796, filed on Sep. 29, 2017.

(51) Int. Cl.
| | |
|---|---|
| *G01R 22/06* | (2006.01) |
| *H02J 7/00* | (2006.01) |
| *H03F 3/45* | (2006.01) |
| *H05K 7/14* | (2006.01) |
| *H05K 7/20* | (2006.01) |
| *H05K 5/00* | (2006.01) |
| *H03M 1/66* | (2006.01) |

(52) U.S. Cl.
CPC .......... *H02J 7/0068* (2013.01); *G01R 22/068* (2013.01); *H02J 7/0029* (2013.01); *H03F 3/45475* (2013.01); *H05K 5/0086* (2013.01); *H05K 7/1427* (2013.01); *H05K 7/20136* (2013.01); *H05K 7/20209* (2013.01); *H03F 2200/129* (2013.01); *H03F 2203/45116* (2013.01); *H03M 1/66* (2013.01)

(58) Field of Classification Search
CPC .. H05K 7/20209; H05K 7/1427; H02J 7/0029
See application file for complete search history.

(56) References Cited

U.S. PATENT DOCUMENTS

| | | | | |
|---|---|---|---|---|
| 9,312,874 | B1* | 4/2016 | Kakolaki | H03M 7/30 |
| 2010/0265112 | A1* | 10/2010 | Ek | H03M 1/0678 |
| | | | | 341/144 |
| 2014/0055283 | A1* | 2/2014 | Ching | H04Q 9/00 |
| | | | | 340/870.02 |

(Continued)

*Primary Examiner* — Alvaro E Fortich
(74) *Attorney, Agent, or Firm* — Pitts & Lake, P.C.

(57) ABSTRACT

The present general inventive concept is directed to a signal generation system, device, and method for meter testing, including a digital signal generator to generate an arbitrary digital test signal, a digital-to-analog converter to convert the arbitrary digital test signal to an analog test signal, a signal converter to convert the analog test signal to a differential pair of signals corresponding to the analog test signal, and a power signal generator including: an input module to receive the differential pair of signals; an amplifier to amplify the differential pair of test signals; and an output module to output an output differential pair of signals to a load, to feed back a proportional representation of the output differential pair of signals to the input module, and to receive the amplified differential pair of signals from the amplifier.

68 Claims, 5 Drawing Sheets

(56) References Cited

U.S. PATENT DOCUMENTS

| | | | | |
|---|---|---|---|---|
| 2015/0346288 A1* | 12/2015 | Hardy | ................. | G01R 31/40 |
| | | | | 702/58 |
| 2016/0327615 A1* | 11/2016 | Wallace | ............. | G01R 31/52 |
| 2018/0188346 A1* | 7/2018 | Salem | ................. | B60L 53/14 |

* cited by examiner

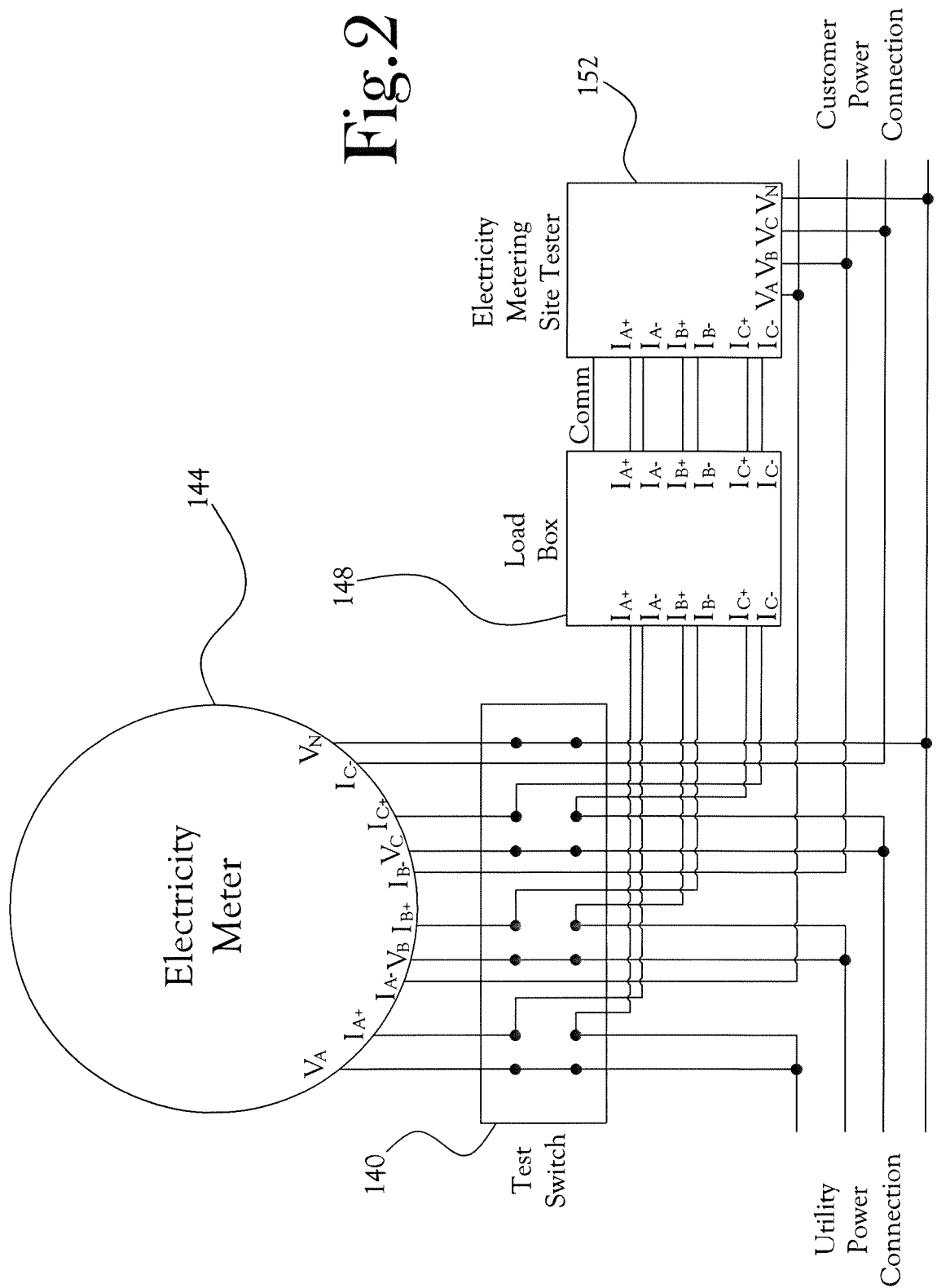

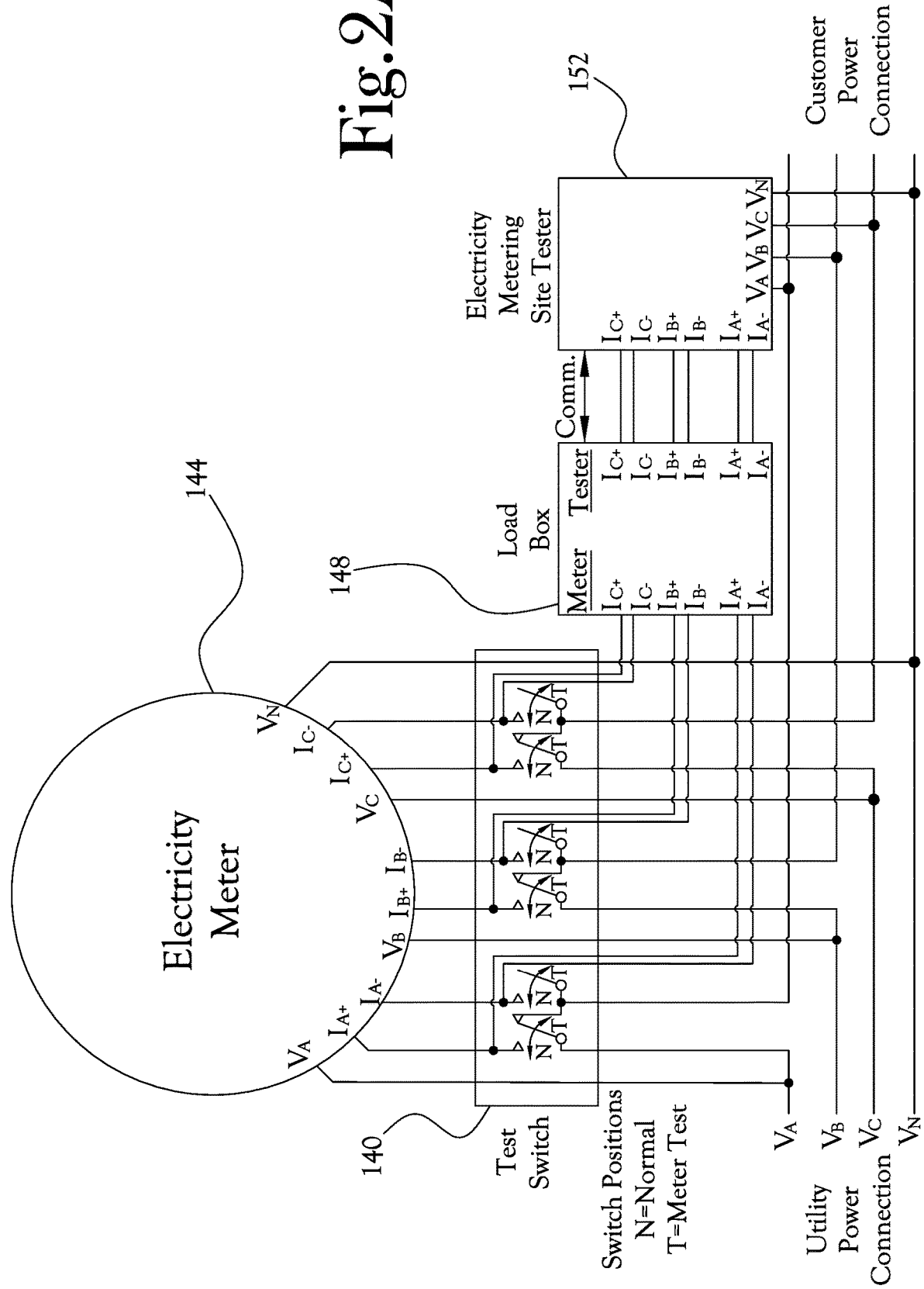

Cascaded Digital Isolator Block Diagram

SELF-CONTAINED POWER SIGNAL GENERATION SYSTEM FOR ELECTRICITY METER TESTING

CROSS-REFERENCE TO RELATED APPLICATIONS

This application claims the benefit of U.S. Provisional Patent Application Ser. No. 62/565,796, filed on Sep. 29, 2017, the contents of which are incorporated herein by reference in its entirety.

FIELD OF INVENTION

The present general inventive concept relates to a system for testing electricity meters, and, more particularly, to a portable, battery operated capable load box for testing electricity meters and other auxiliary portions of installation sites.

BACKGROUND

Electricity meters are well known to measure electrical power consumption. Electricity meters should be tested to ensure the meters are measuring power accurately. Electricity meters can be tested using a load box to input a desired test signal into the meter, and then measure the performance of the meter to verify that the meter is performing properly. Challenges arise in meter testing when the relevant test signal is not readily available in the field and when the relevant test signal is associated with a high voltage environment. Test sites can also be subject to large amounts of electromagnetic noise, hindering testing stability and accuracy. Moreover, conventional load boxes are typically rather large and heavy, making it difficult for a technician to easily carry and transport the load box to a particular testing site.

As such, there exists a need for a portable and self-contained power signal generation system that is capable of generating a large range of signals for varied and thorough testing of electricity meters in the field, and which maintains fidelity whether the generated test signals are very low or very high. This application is related to co-pending application "Method and Device For Power Signal Generation Utilizing A Fully-Differential Power Amplifier," U.S. application Ser. No. 16/148,962, filed on Oct. 1, 2018, which is incorporated herein by reference in its entirety.

SUMMARY OF INVENTION

The present general inventive concept provides various embodiments of an electricity meter load box and system that includes features such as being battery-operated so as to remove the need for an external AC power source; using differential signals to reduce electronic noise and increase accuracy and stability of the test signal; using high-frequency switching to reduce the size and weight of the load box; and using signal isolation to improve accuracy of the test, protect equipment and personnel, and provide proper function.

Example embodiments of the present general inventive concept may be achieved by providing a self-contained power signal generation system, including a self-contained power source configured to provide electrical operating power to the self-contained power signal generation system, a power signal generator configured to provide power to drive an electrical load with an output test signal corresponding to an input reference signal with substantially high fidelity reproduction, and a self-contained reference signal source configured to generate the input reference signal.

Example embodiments of the present general inventive concept may be achieved by providing a self-contained power signal generation system including a test signal generator configured to generate a test signal, a single-ended-to-differential converter configured to convert the test signal to a differential pair of test signals, and a signal waveform source configured to receive and condition the differential pair of test signals and output the signals to a load, wherein an input, output, and feedback are all differential.

Example embodiments of the present general inventive concept may be achieved by providing a self-contained power signal generation system including a three-phase, 5-amp current source configured to generate a meter test signal, a battery and a handheld portable case encasing the current source and battery, wherein the battery is configured to fully power the three-phase, 5-amp current source.

Example embodiments of the present general inventive concept may be achieved by providing a method of verifying accuracy of an electricity meter, the method including generating a test signal using any of the signal generation systems described herein or otherwise within the scope of the present general inventive concept, applying the test signal to an electricity meter, measuring the test signal as applied to the meter using an external power measurement device, and comparing a measured test signal from the external power measurement device to a measurement of the test signal from the meter.

Example embodiments of the present general inventive concept can be achieved by providing a signal generation system for meter testing, including a digital signal generator to generate a digital test signal, a digital-to-analog converter to convert the digital test signal to an analog test signal, a signal converter to convert the analog test signal to a differential pair of signals corresponding to the analog test signal, and a power signal generator including: an input module to receive the differential pair of signals; an amplifier to amplify the differential pair of test signals; and an output module to output an output differential pair of signals to a load, to feed back a proportional representation of the output differential pair of signals to the input module, and to receive the amplified differential pair of signals from the amplifier.

Additional features and embodiments of the present general inventive concept will be set forth in part in the description which follows, and, in part, will be obvious from the description, or may be learned by practice of the present general inventive concept.

BRIEF DESCRIPTION OF THE FIGURES

The following example embodiments are representative of example techniques and structures designed to carry out the objects of the present general inventive concept, but the present general inventive concept is not limited to these example embodiments. In the accompanying drawings and illustrations, the sizes and relative sizes, shapes, and qualities of lines, entities, and regions may be exaggerated for clarity. A wide variety of additional embodiments will be more readily understood and appreciated through the following detailed description of the example embodiments, with reference to the accompanying drawings in which:

FIG. 2 illustrates an example meter site test setup in which a power generation system according to an example embodiment of the present general inventive concept may be used;

FIG. 2A illustrates another example meter site test setup in which a power generation system according to an example embodiment of the present general inventive concept may be used;

DETAILED DESCRIPTION

Figure 1:
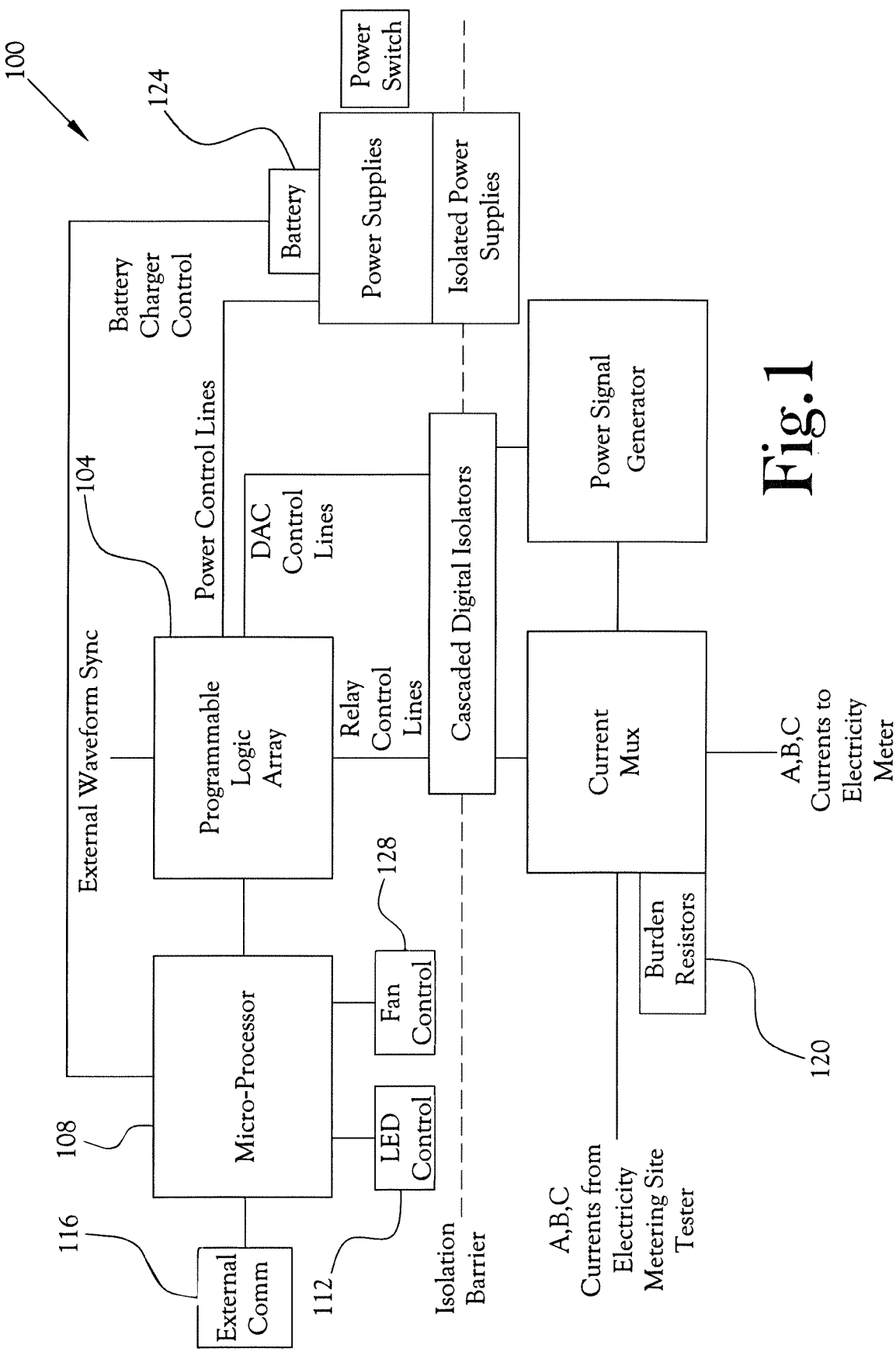
FIG. 1 is a block diagram illustrating a power signal generation system according to an example embodiment of the present general inventive concept.

Reference will now be made to the example embodiments of the present general inventive concept, examples of which are illustrated in the accompanying drawings and illustrations. The example embodiments are described herein in order to explain the present general inventive concept by referring to the figures.

The following detailed description is provided to assist the reader in gaining a comprehensive understanding of the structures and fabrication techniques described herein. Accordingly, various changes, modification, and equivalents of the structures and fabrication techniques described herein will be suggested to those of ordinary skill in the art. The progression of fabrication operations described are merely examples, however, and the sequence type of operations is not limited to that set forth herein and may be changed as is known in the art, with the exception of operations necessarily occurring in a certain order. Also, description of well-known functions and constructions may be omitted for increased clarity and conciseness.

Note that spatially relative terms, such as "up," "down," "right," "left," "beneath," "below," "lower," "above," "upper" and the like, may be used herein for ease of description to describe one element or feature's relationship to another element(s) or feature(s) as illustrated in the figures. Spatially relative terms are intended to encompass different orientations of the device in use or operation in addition to the orientation depicted in the figures. For example, if the device in the figures is turned over or rotated, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Example embodiments of the present general inventive concept provide a new and improved battery operated power signal generation system, utilizing isolated differential signals to reduce electronic noise and increase accuracy and stability. Various example embodiments of the battery powered device utilize high frequency DC-DC converters to power the waveform generating electronics, facilitating portability of the device by reducing the size and weight of the power signal generator electronics through the reduction in the size of the magnetics of the isolated DC-DC power electronics. Various example embodiments may also incorporate switching amplifiers, which allows for smaller power devices in the amplifier output stages, further reducing the size of the device. In the various descriptions herein, the terms device and system may be used interchangeably when referring to example embodiments of the self-contained power signal generation system of the present general inventive concept.

Various example embodiments of the battery powered device are configured to generate a test signal when the desired test signal is unavailable or difficult to connect, improving regulation, accuracy, and stability of the test signal in high noise environments. Various example embodiments of the battery powered device may incorporate signal isolation providing features to isolate the user, input signal, and the input power electronics from the waveform generation circuitry.

Conventional AC current source circuits typically require the use of relatively large, low frequency transformers to isolate a high voltage, whereas example embodiments of the present general inventive concept may use relatively small, high frequency isolation to allow the test signal waveform circuitry to float up to a high-voltage potential, thereby isolating high voltage signals with smaller and lighter weight components.

A power signal generation system may be entirely self-contained. Self-contained in these descriptions refers to a power signal generator system that contains, within the design, everything needed to produce power test signals. One such system may utilize a mechanism for powering the system in such a way that does not require external power to be provided in order to operate. An example embodiment of the present general inventive concept employs a rechargeable lithium-ion battery as a mechanism for powering the system in a way that the system does not increase the amount of power drawn from the power utility connection. Since no power is being drawn from the power utility connection by the signal generator, the measurement signals that may be present at the site are not affected by the power being supplied by the self-contained power signal generation system, and will maintain all original attributes that belong to those signals while the electricity meter is nominally operating to provide power measurements for billing information to the utility. The lack of influence on measurement power signals provided by a self-contained power signal generator allows for the truest verification of the accuracy of the measurements being made by the electricity meter. Since the battery being used in various example embodiments may be rechargeable, a battery charging circuit may also be employed in order to simplify the process of recharging the power source. In such an example embodiment, an external AC-to-DC adapter may be used to provide the charging source for the battery, and can also serve as the power source to the system while battery charging is occurring.

Various other example embodiments of the present inventive concept may employ other self-contained power sources in order to provide the test signals of the self-contained power signal generation system. Some of the possible alternative self-contained power sources include, but are not limited to, solar cells, electro-mechanical electrical power generators such as inductive kinetic energy collectors, and other battery technologies such as lithium polymer, nickel-metal hydride, nickel cadmium, lead acid, solid-state batteries such as super capacitors, graphene, lithium sulfur, and lithium iron, among others.

An example embodiment of a self-contained power signal generation system according to the present general inventive concept may also contain an internal reference that is used to generate the output power test signal such that the output power test signal is a representation of the internal reference. FIG. 1 is a block diagram illustrating such a power generation system according to an example embodiment of the present general inventive concept. The example power generation system 100 illustrated in FIG. 1 employs a digitally generated arbitrary reference waveform produced by a programmable logic array (PLA) 104, such as a field programmable gate array (FPGA) integrated circuit. In this example embodiment, precision of the arbitrary reference is determined, in part, by the digital synthesis method employed. Although a reference waveform can be synthesized using analog techniques, by digitally synthesizing the desired reference waveform there are many signal attributes that can be readily controlled precisely and dynamically using variations of algorithms commonly understood by those skilled in the art. Waveform amplitude, phase, frequency, and shape due to harmonic content, are a few example attributes that can be established digitally to create the internal reference signal. Using synthesis techniques such as a numerically controlled oscillator (NCO) allows a predefined normalized waveform template representing a single cycle to be output with dynamically varying frequency. In conjunction with processing logic contained in the FPGA 104, a multi-phase set of output reference signals can be independently controlled with arbitrary amplitude, relative phase, and shape. The smoothness of the signal can be tuned by increasing the number of points and the output frequency, but this must be balanced against the power budget. An example would be a digital system using a 9-bit modulo index to access a reference waveform comprised of $2^9$, or 512, arbitrary points for a given cycle of a waveform representing ≈32.6 µs intervals at a line fundamental of 60 Hz. If the instantaneous level changes between samples exceed the output circuit slew rate, then the number of points in the digital template can be increased to reduce the step size, and the NCO output rate increased to maintain the same fundamental relationship. The output of the signals can be synchronized to an external timing pulse to precisely control phase relationships by dynamically adjusting the output frequency. In this example embodiment of the present general inventive concept, the digital reference waveform can be converted to an electrical analog signal of the desired waveform and presented to the input of a power signal waveform generator capable of driving a desired electrical load with specified amplitudes for a desired signal type, for example, voltage or current. This example embodiment may also employ a digital system wherein the reference signal is user-specified via a user interface to produce an arbitrary reference signal to generate power test signals used for testing. If a site to be tested only has certain test signals present and other signals are desired, synchronization of phase between the existing signals and the signals to be generated may be desired. If synchronization with an external measurement signal is desired an input can be provided in order to measure the phase and then sync the generated reference signal in a manner so that all output signals produced will have a specified phase relationship to the existing signals available. In such an example embodiment wherein the digital reference signal is utilized, the signal can be converted to an analog reference signal to be presented to a power signal generator by using a digital-to-analog converter (DAC), a typical circuit component commonly used by those trained in the art of electronic design.

Other example embodiments of the present general inventive concept may employ other types of self-contained reference signals beyond those explicitly described in this disclosure. One example embodiment may include a built-in analog reference such as a sinusoidal oscillator that creates an analog reference signal at a specific frequency that can be presented to the input of the power signal generator in order to generate the desired power test signals for the system. Other example embodiments may still employ self-contained power but are provided an external signal reference for purposes of simplifying the design and implementation of synchronization with existing test signals present at the site. The external reference in this example embodiment is presented to the system 100 from an external source in a way that should not influence the other measurement power signals present at the site and can maintain all original attributes that belong to those signals while the electricity meter is nominally operating to provide power measurements for billing information to the utility. The generated power test signals are produced from the reference signal presented externally to this embodiment of the present general inventive concept.

The user interface discussed above regarding user input of arbitrary waveforms can be part of a control and/or monitoring module of this example embodiment of the present general inventive concept that performs various other actions of the system. The example embodiment illustrated in FIG. 1 may have a control and/or monitoring module comprised of a microprocessor 108, a FPGA, a communication interface, and other control circuitry. The control and/or monitoring module of this example embodiment utilizes these components for tasks such as, for example, control, monitoring, and communication between the PLA 104 and the microprocessor 108; user interface control such as LED indicators 112; external communication 116 for monitoring and control; external monitoring for phase synchronization; relay control to route signals such as changing routing between the meter to be tested, the power signal generator, burden resistors 120 to be added to the circuit, and a self-contained electricity metering site tester; DAC control for power signal generation; internal system power supply monitoring and control; battery 124 monitoring and control; temperature monitoring; and fan 128 control. While the example embodiment described above is a complex digital module that controls many functions of the system, other example embodiments of a self-contained power signal generation system of the present general inventive concept may employ a control and/or monitoring module as simple as a power switch.

In this example embodiment of the present general inventive concept, the microprocessor 108 and FPGA 104 work closely together to provide many system functions. This may be achieved in part using a parallel communications bus between the microprocessor 108 and FPGA 104. The use of the parallel communications bus allows communication with, and programming of, the FPGA 104 from the microprocessor 108 with the use of internal storage in the microprocessor or additional storage devices used to store the programming information. The microprocessor 108 can also directly control the FPGA 104 utilizing this bus. Some additional functions that may also be implemented in the microprocessor 108 and FPGA 104 portions of this example embodiment of a control and/or monitoring module are described herein.

As described above, one type of user interface in the control and/or monitoring module is a plurality of indicator LEDs 112 to notify users of system 100 statuses such as, for example, communication activity, power status, power signal generation output on or off, and battery charge level. Other user interfaces may include, but are not limited to, displays, personal computers, cellular phones, tablets, signal monitoring devices, and other external devices that can either monitor, control, or display information such as diagnostic data. Many of these user interfaces may utilize a communication interface connected to the microprocessor 108 in order to control or monitor processes of the system 100. The communication interface may be configured as, for example, a wired digital serial or parallel interface such as RS-232, USB, or Ethernet, or the like; or a wireless interface such as Bluetooth or Wi-Fi, or the like. The communication interface may also be used in various example embodiments of the present general inventive concept to remotely program the microprocessor 108, and in turn, the FPGA 104.

In an example embodiment of the present general inventive concept an electricity meter site tester may be utilized to monitor the signal attributes of the power signal generator output test signals by communicating through a wired RS-232 port. The FPGA 104 may also be configured to receive an external waveform sync signal, as illustrated in FIG. 1, which the electricity meter site tester can monitor in order to send control signals to the power signal generator in order to synchronize generated power signals with signals previously present at the meter site being tested.

The present general inventive concept described herein may be described fundamentally as a relatively high power test signal source. The electric power industry (and as used herein) identifies this type of device as a "Load Box," which may seem confusing to persons trained in the general art of sourcing power to a load. To clarify, the load box reference arises from the perspective that a power meter or power measuring device is measuring the power that is supplied to the customer and is causing an increase in the loading on the electric power generation system from the utility company. The load that is drawn by the customer is emulated by a power signal generator for the purpose of testing the accuracy of the measurement equipment when there is limited or no power signals present to perform the desired test.

FIG. 2 illustrates an example meter site test setup in which a power generation system according to an example embodiment of the present general inventive concept may be used. FIG. 2 illustrates just one possible configuration of a meter site test setup in which an example embodiment of the present general inventive concept may be used to test various aspects of the meter site using the example embodiments described herein, wholly or in part. For example, FIG. 2A illustrates another example meter site test setup in which a power generation system according to an example embodiment of the present general inventive concept may be used. Typical test sites may include a test switch 140 that is connected to the meter 144 to be tested in order to easily make series connections to the currents and parallel connections to the voltages. The test switch 140 is configured in line with the electricity meter 144 between the utility power connection and the customer power connection. The self-contained power signal generation system various example embodiments of the present general inventive concept, referred to in FIG. 2 as the load box 148, can be connected along with an electricity metering site tester 152 at the test switch 140 in order to create the appropriate connections for power signal generation or test signal measurement. It may also be useful for various example embodiments of the present general inventive concept to provide a means of loading certain equipment at the site with additional resistance, or adding burden, in order to expose possible problems within this equipment. A current transformer (CT) is one such example of a device that is used to appropriately scale the current to levels that are more reasonable for an electricity meter to measure and will exhibit possible issues when more and more burden is added to it as a load. Since there are multiple configurations that the load box 152 may need to be configured as in order to pass existing current, generate current, or add burden, a relay module may be utilized. The relay module may be controlled by the FPGA in order to route power test signals through the appropriate path for a specified function. Without a test switch at the site, another mechanism for breaking the current loop to connect the load box 148 in series may be employed in order to inject the current into the circuit for testing. Voltage can be connected directly as long as voltage is present at the site or is being generated from an example embodiment of the present general inventive concept by a load box that also, or instead of current, has the capability of supplying voltage power signals.

Figure 3:
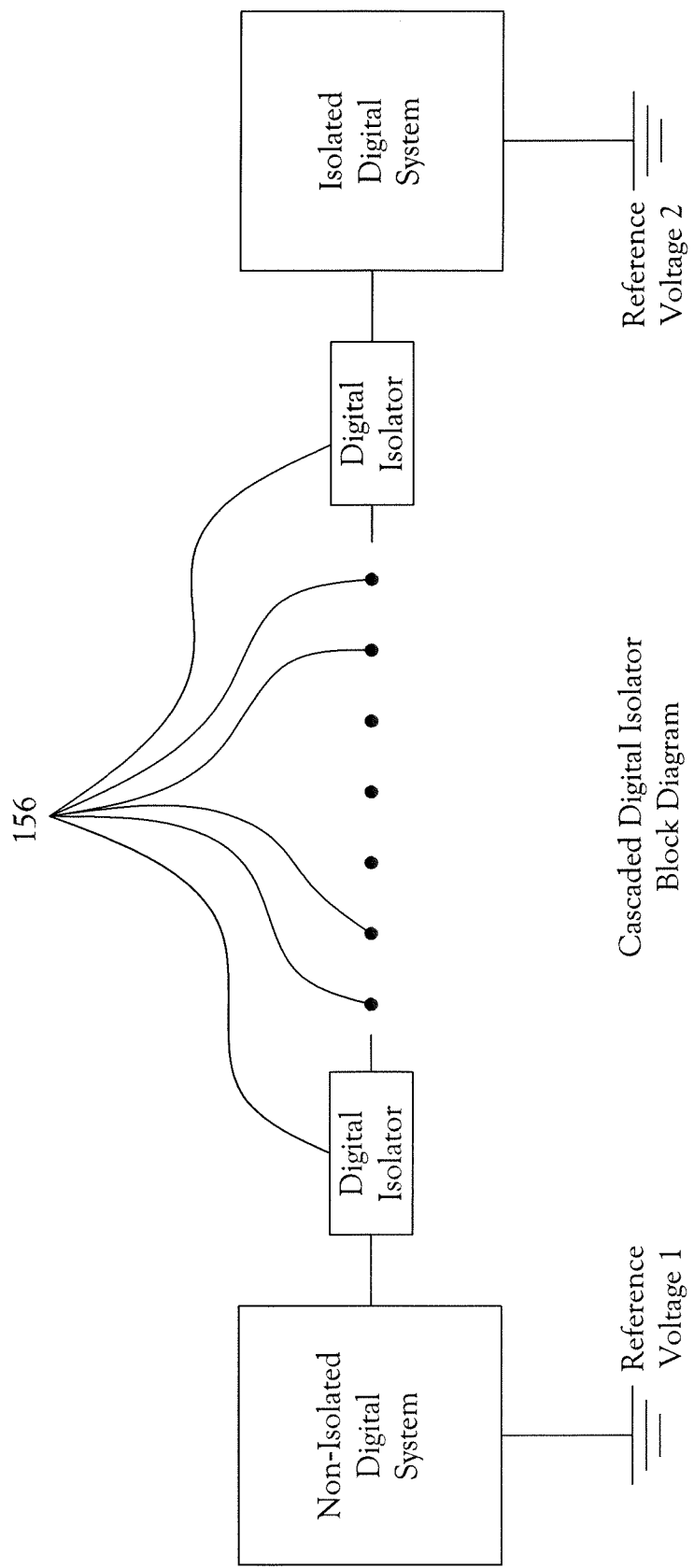
FIG. 3 is a block diagram illustrating a cascaded digital isolator according to an example embodiment of the present general concept.

The current connections present at the metering site to be tested may be electrically connected to dangerous levels of potentials that could be harmful to users or the test equipment. For this reason, an example embodiment of the present general inventive concept may employ galvanic isolation for the power of the relays and relay drivers, the relays between their control circuitry and signal terminals, and the digital signals used to control the relays. Isolated DC-DC converters can be employed to power the relays and relay drivers in order to maintain adequate isolation for safety and proper operation in the presence of substantially large potentials at the site on the current connections since the load box connects directly to these terminals for test. Providing isolation at the substantially high switching frequency of the DC-DC converters helps to increase efficiency of the power being transferred over the isolation barrier and minimize the weight and size of the magnetics used for isolation as opposed to directly isolating the lower frequency test signals used at the metering site for testing. Similarly in example embodiments of the present general inventive concept, the digital signals used for the relay control signals as well as DACs used in the example power signal generators (described herein, and illustrated in FIG. 4) are isolated since the digital signals are generally at much higher frequencies than the analog signals being presented to the metering site as test signals. This also helps increase efficiency and minimizes the weight and size of the magnetics used for isolation. FIG. 3 is a block diagram illustrating a cascaded digital isolator according to an example embodiment of the present general concept. To achieve adequate isolation for the safety of the users and the equipment, the plurality of digital isolators, as illustrated in FIG. 3, may be cascaded in order to increase the effective amount of isolation provided by the digital signal isolation to levels much larger than those possible with a single stage of isolation.

A microprocessor with built-in analog-to-digital (ADC) inputs may be utilized in this example embodiment to monitor the voltages and/or current draws of the various system power supplies. This can be useful diagnostic data to report to the user in order to maintain proper operation. This can also be employed for the battery charging and discharging. Recall that this self-contained power signal generation system of the present general inventive concept may be implemented utilizing a lithium-ion battery as the self-contained power source. Since the power signal generator may be generating substantial power in order for the power signals to drive the real-world loads found at metering sites, an algorithm can be employed to indicate if the load is too large to drive based on the power density remaining in the battery by utilizing the ESR of the battery that is indicated by the increasing voltage drop that can be measured when the current draw from the battery is increased. The amount of current being supplied from the battery is directly proportional to the amount of power being presented to the electrical load at the metering site. The efficiency of the power signal generation with varying load and temperature may need to be accounted for in this algorithm, but a first order algorithm may also be utilized if these phenomena are substantially constant for a coarse determination of whether a load can be driven with the remaining battery capacity. A more precise algorithm may be used as a way to measure the amount of electrical load being driven by using the power signals being generated as the interrogation signals and the battery voltage and current measurements as the input power to the algorithm. This may also be implemented more directly with additional measurements made at the load to include both the voltage and the current present. Considerations may be made in these determinations based on how many phases of power signal generation the example embodiment is providing. In this example embodiment of the present general inventive concept, temperature monitoring is provided by an integrated circuit connected to one of the ADC inputs of the microprocessor. This monitoring information can be used to improve the algorithm described above to compensate for the temperature effects on efficiency. It can also be used to provide speed control for the cooling fans implemented in various example embodiments of the present general inventive concept.

Utilizing the temperature monitoring, a pulse width modulation (PWM) signal may be applied to fan drive circuitry to effectively control the DC level out presented to the fans in order to control air flow over the parts that dissipate significant power. This example embodiment of the present general inventive concept also employs a mechanical design that facilitates substantially more efficient cooling of componentry that dissipates significant amounts of power. Effective and efficient cooling may be accomplished by configuring printed circuit board assemblies in a way that limits air flow in all directions except from a focused fan inlet blowing in one side and a focused fan outlet drawing air out of the opposing side, forming an effective wind tunnel of air that exchanges air rapidly over the surface of components that dissipate power. For this reason, maximum efficacy of the wind tunnel may be achieved when all components that dissipate a substantial amount of power are contained within the wind tunnel, ideally in a position in which unrestricted airflow can be maintained in the effective wind tunnel. The inlet and outlet of air can be comprised of single fans or a plurality of fans to create the wind-tunnel effect. Example embodiments of the present general inventive concept may also employ multiple air inlets and outlets to focus the air as needed to provide an optimum cooling effect.

Figure 4:
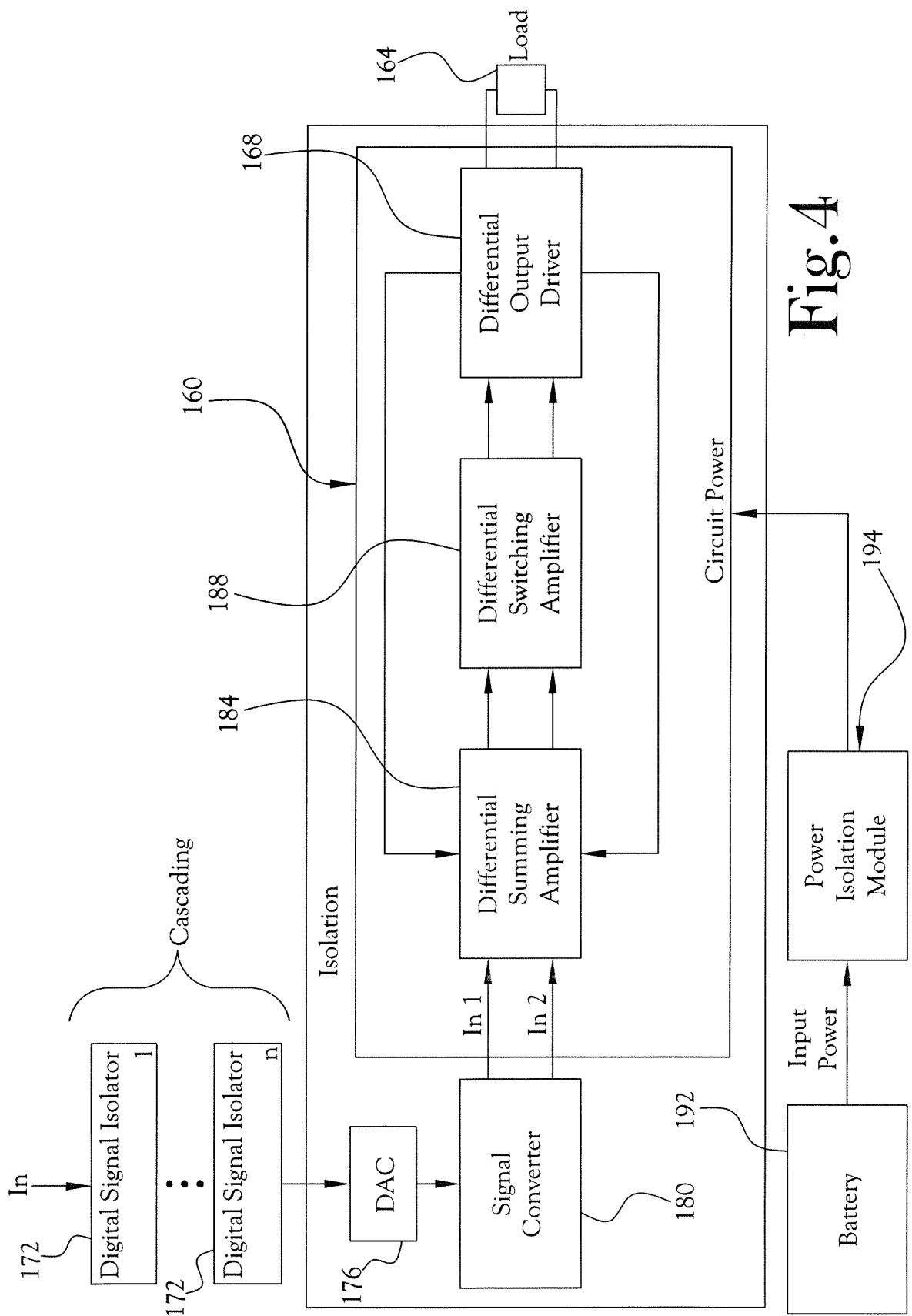
FIG. 4 is a block diagram illustrating a battery powered, isolated signal generation system configured in accordance with an example embodiment of the present general inventive concept.

FIG. 4 is a block diagram illustrating a battery powered, isolated signal generation system configured in accordance with an example embodiment of the present general inventive concept. For convenience of illustration, the block diagram of FIG. 4 illustrates a single phase implementation of typical three-phase AC current source, but it is understood that similar implementations can be provided for the current source for the other 2 phases, and it is also understood that similar constructions and concepts can be used to generate voltage signals. Although some testing applications, for example, utilize a sinusoidal current signal fixed at 60 Hz, the present general inventive concept is not limited to any particular type or frequency of test signal, and any number of different test signals and/or frequencies may be used, including but not limited to sawtooth waves, square waves, pulse signals, etc.

In the example embodiment of the present general inventive concept illustrated in FIG. 4, the desired input signal is designated as In. The input signal In is a digitized version of the desired analog signal to be used for testing the meter equipment. As the signal delivered to a load 164 by a differential output driver 168 can be associated with high voltage, it can be important to isolate the input signal from the waveform generation circuit componentry. As illustrated in FIG. 4, the digital input signal In can be isolated from the waveform generation circuit 160 by one or more cascading digital signal isolators 172. The input signal In can be presented to a Digital-Analog-Converter (DAC) 176 to produce a single-ended analog version of the digital input signal, which in turn is converted by a signal converter 180 to differential (equal and opposite) analog signals identified as In 1 and In 2. The difference between In 1 and In 2 corresponds to the user's desired test signal to be delivered to the load 164.

The cascaded digital signal isolators 172 in FIG. 4 may be referred to as an isolation module to isolate the digital test signal, and may include at least a pair of the digital signal isolators 172. To help ensure the device meets IEC 61010-1, CAT IV 600V compliance, off the shelf digital signal isolators may be cascaded. A single off the shelf isolator may typically provide inadequate isolation needed to meet compliance, therefore two or more of the isolators may be cascaded to achieve the required isolated voltage. Two such isolators provide up to twice as much isolated voltage as that provided by only one of the isolators, and with very small components. Otherwise, the use of a larger isolator designed to isolate higher levels of voltage could detrimentally increase the size of the overall device/system. An off-the-shelf isolator is used successfully with on-chip transformers to create signal and power isolation.

The differential input signal pair In 1 and In 2 are provided to Differential Summing Amplifier 184 of the waveform generation circuit 160. The Differential Summing Amplifier 184 presents the sum of the differential input signal and the differential feedback signals from the Differential Output Driver 168 to a Differential Switching Amplifier 188. The Differential Switching Amplifier 188 amplifies and modulates the summation signal for presentation to the Differential Output Driver 168 in a form that minimizes power consumption, again minimizing the size of power devices and maximizing battery life. The Differential Output Driver 168 outputs the differential output signal to the Load 164 for testing. In this way, the system of FIG. 4 provides test signals when there are no such signals, or no desirable signals, are available. For example, it can operate as a three-phase AC current source. The Differential Output Driver 168 also utilizes noise-canceling differential feedback to the Differential Summing Amplifier 184 to improve stability and accuracy of the differential output signals applied to the load 164. Here, substantially instantaneous, inverted, and proportional representations of the differential output signals are fed back to the Differential Summing Amplifier 184 which serves to cancel noise, improve stability and accuracy, and reduce unwanted harmonics of the differential output signal used to test the load 164. The load 164 is directly coupled to the waveform generation circuit 160 (which is fully isolated from earth) resulting in the differential output signals not being affected by likely Load 164 connections to earth. This keeps the differential signals between the Differential Output Driver 168 and the Load 164 the same.

A differential amplifier can be used to increase common-mode noise rejection, thereby allowing better stabilization of the load box output, and matched resistor networks to provide better common-mode rejection. The differential signal input to the waveform generation circuit 160 provides common mode noise rejection, which rejects the types of noise that occurs in real world applications. By responding only to the difference between In 1 and In 2, because the signal noise on both will provide a difference of zero, the noise is rejected, resulting in a more robust noise rejecting circuit. Differential digital-to-analog converters (DAC) are typically expensive and difficult to implement in real world applications. Example embodiments of the present general inventive concept may employ a single-ended-to-differential conversion circuit to allow a single-ended DAC output to be used differentially in the waveform source circuitry.

In some embodiments the analog signal may be a differential voltage signal that looks like the current to be generated. From the input points of In 1 and In 2 and throughout the current generation circuit to the load 164, all of the signal processing is purely differential. Thus, the input is differential, the feedback is differential, and the output is differential, and fully differential throughout the forward path, as well. Conventional circuitry providing such feedback typically provides single-ended feedback. The circuitry illustrated in FIG. 4, however, provides two virtually identical, equal and opposite feedback paths from the Differential Output Driver 168 to the Differential Summing Amplifier 184 that preserve the common-mode rejection property in the feedback. The circuitry provides equivalent amounts of feedback to the signals In 1 and In 2. Thus, whenever the output signal needs to be adjusted from the feedback, it is done equally and oppositely on both paths. This prevents common-mode noise from becoming a problem throughout the circuit. Such a configuration used with the aforementioned isolation of the waveform generator 160 provides an output that is also purely differential. Thus, if the load 164, or impedance, is grounded to earth, it will not affect the integrity of the differential output signals, because if any one of the differential output signal currents is moving in one direction, the other signal current is equal and moving in the opposite direction. No current will flow to ground through the load 164 or otherwise be lost, regardless of the impedance of the load 164. The isolation of the signals and the conversion to differential signals allows the device illustrated in FIG. 4 to take advantage of these equal and opposite signals when encountering potentials on the order of ±20,000 volts.

In some embodiments, the currents measured at the meter site are sinusoidal. However, the present load box is a digitally based system, and therefore can produce most arbitrary waveforms that could be desired. This is desirable because AC power waveforms often have high amounts of noise up to 50th order harmonics. The latest ANSI C12 metering standard dictates certain waveforms that have to be created in testing meters, and so the device and system according to various example embodiments of the present general inventive concept is designed to generate not only a pure sinusoidal waveform, but also, for example, harmonics up to or exceeding the 50th order of, for example, 60 Hz.

Referring to FIG. 4, the illustrated device has a battery 192 that not only operates the device itself, but also supplies the power dissipated in the load driven by sourced voltage and/or current being generated. Thus, to produce the three-phase source, there are three actual outputs of voltage and/or current, all produced by the onboard battery 192 of the device of FIG. 4. Typically, on a voltage source, a high resistance load is a very small load. Conversely, on a current source, a low resistance load is a very small load. If the current source load is zero ohms, no power is being dissipated. As the load grows larger, such as from 50 milliohms to 100 milliohms, then four times the real power is delivered to the load.

The battery 192 illustrated in FIG. 4 may be a 12-volt lithium battery having 3.1 amp-hours. Example embodiments of the general inventive concept may be powered from a utility line-connected power source as with typical larger and less efficient load box systems, a battery alone, or both. Various other example embodiments may employ a battery with different ratings according to the device needs and sound engineering judgement. Various example embodiments may also include a power electronics module 194, also referred to as a Power Isolation Module 194, to power the waveform generator circuit 160. As illustrated in FIG. 4, the battery 192 provides the input power to the power isolation module 194, which can include a DC-DC converter configured to isolate large voltages, such as ±20,000 V. The power isolation module provides power to the waveform generation circuit 160, enabling the waveform generation circuit 160 to generate the interrogation (i.e., test) signal. Each phase of the three-phase current source can be at a different potential at any given time, and may often be significantly higher than ground potential. Consequently, a three-phase embodiment will produce isolated power for each phase. It is possible to isolate the power electronics from the test signal waveform generating circuitry by using high frequency transformers (e.g., 100 kHZ to 500 MHz). For example, high frequency transformers can be used in a DC-DC converter to isolate the power electronics from the circuit 160, facilitating portability of the device by reducing the size and weight of the transformer magnetics relative to lower frequency transformers. In the power isolation componentry, a DC to AC conversion is made which produces a high frequency AC signal, and therefore can be isolated with a physically smaller transformer to produce the isolation of high frequency AC, and the AC signal is then transformed back to DC, which is the type of power supplied by the battery, and which cannot be passed by a transformer.

The higher frequency that is passed across the transformer, the smaller the magnetics of the transformer may be. The power and components of each phase are isolated so that all those loads may be driven at the different potentials without causing electrical problems in the circuitry. The phases are isolated from one another, and from ground. The use of a relatively small flyback transformer to isolate the power electronics allows a reduction in the size of magnetics and other parts that helps to decrease the size and weight of the entire device into a much more manageable and portable tool, and also allows the device to be battery powered.

The waveform generation circuit 160 can function as a negative feedback amplifier. A transformer can be located in the power isolation componentry. Unlike traditional analog power transformers that step up either the current or voltage, the transforming in the present device is instead provided by the amplifier. The isolation characteristic of the typical analog power transformer is replaced in the present device by the digital isolator and power isolation module 194. By isolating at the power and digital signals, the device can be formed with smaller magnetic components, as opposed to isolating at the output. The device can run at a much higher frequency, which minimizes the size of the magnetics. Traditional power amplifiers running at 60 Hz require large magnetics and transformers. The device of FIG. 4 may be configured to run at frequencies of tens of kHz or hundreds of MHz. The signal is again converted to DC on the isolated side. This may be implemented with a typical flyback DC-DC converter. Thus, in FIG. 4, DC power is supplied to the power isolation componentry from the battery 192, and from the power isolation componentry to the current generation circuit, but a DC to AC conversion and isolation of the power occurs in the power isolation componentry before being transformed back to DC. Isolating the signal at 60 Hz would require a transformer that is too large for a readily portable device, but isolating at a much higher frequency, such as hundreds of kHz, which is multiple orders of magnitude larger, allows the device of the present general inventive concept to use a much smaller transformer, thus decreasing the overall size and weight of the device and making it much more user friendly in the portability and weight aspects to the technician. This is especially valuable when one considers that the size reduction is across three transformers, which is one for each phase of the load box signal. In modern power systems, a large concern is the harmonics that ride on the 60 Hz sinusoidal waveforms, and how they affect the meter's power measurement accuracy. The device of FIG. 4 is able to generate signals such as these to comply with the most recent ANSI standards for meter registration.

In the case of AC signals, it is desirable for the AC current source to have low noise and good linearity. Fully differential, multi-pole Bessel filters can be employed to reduce noise and preserve the shape of the waveform, thereby providing a good linearity over frequency.

Various example embodiments of the present general inventive concept may employ paralleled multiple isolated current output stages to provide higher current output using components with decreased size, weight, and cost, compared with conventional devices. Example embodiments may include an AC current source that can provide three independent, fully isolated current outputs for true three-phase AC current source testing.

Example embodiments of the present general inventive concept provide a system that may be used as an accessory to complement a meter site tester such as, for example, the PowerMaster® 3 Series hand-held three-phase meter site tester. In combination with such a meter tester, a user will have the ability to perform three-phase phantom load meter testing up to, for example, 5 Å while implementing the new current harmonic waveforms from the ANSI C12.20 metering standard. In this method of testing, a meter tester such as the 3 Series can be used to measure the current and voltage that the meter is seeing from the load box, and the measurements from the meter and the 3 Series can be compared to see if the meter is accurately measuring the signals from the load box.

In addition, an example embodiment of the present general inventive concept may give the user the ability to perform an automated, user-selectable CT burden added test. The compact size of example embodiments of the present general inventive concept allows the subject device, the 3 Series meter site tester, and all standard accessories to be stored in the same carrying case, and add increased functionality to the 3 Series tester. Such increased functionality may include a battery powered current source requiring no external AC voltage, three-phase phantom load testing, CT added burden testing, and self-contained lightweight packaging that includes storage of cables and probes. Various example embodiments of the present general inventive concept may provide several features that make them a desirable alternative to conventional devices typically available, such features including: providing an electricity meter load box in a smaller, more convenient device; providing a true one-case solution, containing the analyzer, cables, and probes all in one case; the ability to leave the cables connected to the analyzer device to reduce the amount of time hooking up cables at each site; having an internal battery to avoid requiring an auxiliary power source; improved reliability, load regulation, and shorter downtimes; and IEC 61010 safety certification. Various other features and/or advantages will be recognized in the descriptions of example embodiments of the present general inventive concept contained herein. Such a device and system may present enhanced functionality in a host of applications such as, for example, site verification; revenue protection; customer load meter testing; Wh, VARh, and VAh meter testing; forward and reverse energy flow testing; element testing; calibration verification; CT added burden testing; CT ratio testing; CT burden measurement; vector analysis; harmonic capture; waveform analysis; and so on.

Thus, various example embodiments of the present general inventive concept provide a lightweight and economical device, or accessory, to allow utilities to perform phantom load ANSI meter tests on their transformer rated and self-contained sites, and perform burden added CT testing. Example embodiments offer true three-phase current source up to 5 amps per phase for ANSI meter testing, and burden added up to 2 ohms in five steps for CT testing. The waveform generator is configurable for virtually any current and any power factor a user wants to test. In addition to Watthour testing, the accessory also allows testing for VAR-hour and VAhour. It also has the ability to perform meter testing under forward or reverse energy flow, and can test individual elements of the meter as well. The current source can also generate waveforms including purely sinusoidal waveforms and signals with harmonic conditions. The device is designed with CAT IV 600V safety compliance.

A variety of testing performed with embodiments of the present general inventive concept includes performing a true three-phase ANSI meter test on a form 9S meter under the test points of full load, power factor, and light load. With the device according to an example embodiment of the present general inventive concept, such tests can be performed directly at the meter test switch in the field, eliminating the need to pull the meter and test it with an expensive meter test board. Such a device/system increases testing efficiency while also lowering cost.

As described and illustrated herein, example embodiments of the present general inventive concept can provide a signal generation system for meter testing, including a digital signal generator to generate a digital test signal, a DAC to convert the digital test signal to an analog test signal, a differential signal generator to convert the analog test signal to a differential pair of test signals corresponding to the analog test signal, and a waveform generator including: an input module to receive the differential pair of test signals; an amplifier to amplify the differential pair of test signals; and an output module to output the differential pair of output signals to a load, to feedback the differential pair of output signals to the input module, and to receive the amplified differential pair of test signals from the amplifier. Various example embodiments can provide a three-phase, 5 amp AC current source that is wholly battery powered, and may be housed in a portable handheld case.

The device of FIG. 4 is configured to generate and produce selectable values of current, up to 5 amps. While the device of FIG. 4 may be used when there is no customer current available, it may also be used in lieu of using the available current by bypassing the customer load, thus producing a more stable interrogation current. Another function of the present general inventive concept is the added burden testing, which is achieved by adding extra series resistance to the secondary side of the CT, thereby being able to determine how much added burden is necessary to make the CT move out of its compliance accuracy. To perform such added burden testing, the device of FIG. 4 may act as a multiplexor that switches different burdens to the CT at the site to measure the different accuracy effects. The device has a series of resistors to allow different predetermined levels of burden to be selected and tested at the meter. Typically, the larger the added burden the more inaccuracy the added burden is likely to cause to a CT that may need to be replaced.

While most of the example embodiments of the present general inventive concept have been described in terms of AC current sources, the concept also applies to a voltage source. According to the duality concept of electricity and magnetism, equivalent circuits may be represented as Norton equivalent circuits for current sources (such as the PowerMaster® 3 Series embodiment example) and Thevenin equivalent circuits for voltage sources. Thus, the present general inventive concept including the example embodiment illustrated in FIG. 4 encompasses both voltage test signals and current test signals.

Example embodiments of the present general inventive concept may provide a device and system with various specifications, including but not limited to, three direct inputs rated from 100 mA to 20 A RMS; an auxiliary power input rated from 120 to 240 VAC; a current source to provide an AC current through three outputs, each rated 100 mA to 5 A RMS max with a power factor of −1.00 to 1.00; an automated CT burden added test, user selectable at 0.1, 0.3, 0.5, 1.0, and 2.0 ohms; environmental operating tolerances including temperatures of −20 to 50 degrees Celsius, an operating humidity of <95% RH, non-condensing at 23 degrees Celsius; a 3100 mAh Li-ion battery having a 3 hour charging cycle at 0 to 40 degrees Celsius; a total package weight, including case and 3 series meter tester, of less than 20 pounds; safety features including isolation protection of IEC 61010-1 (2010), measurement category of CAT IV 600V, and a degree of protection of IP-40.

Example embodiments of the present general inventive concept may function as a burden and load box device/system having a current source of up to 5 A max and an added burden up to 2 ohms, while other example embodiments may function as a load box only device/system having a three-phase current source of up to 5 A per phase, or as a burden only device/system having an added burden up to 2 ohms, but the present device/system is not limited thereto.

Various example embodiments of the present general inventive concept may provide a self-contained power signal generation system, including a self-contained power source configured to provide electrical operating power to the self-contained power signal generation system, a power signal generator configured to provide power to drive an electrical load with an output test signal corresponding to an input reference signal with substantially high fidelity reproduction, and a self-contained reference signal source configured to generate the input reference signal. The self-contained power signal generation system may further include a control system configured to operate the self-contained power signal generation system. The control system may be configured as a control and monitoring module including a wired communication interface. The control system may be configured as a control and monitoring module including a wireless communication interface. The self-contained power source may be a battery. The self-contained reference signal source may include a DAC configured to receive an arbitrary digital reference signal produced by the control system, and to produce an analog reference signal corresponding to the arbitrary digital reference signal. The self-contained power signal generation system may further include a digital signal isolation circuit configured to isolate the DAC from ground potential of the control system which produces the arbitrary digital reference signal received by the DAC, and an isolated power electronics module configured to supply isolated power to the power signal generator and to isolate the power signal generator from earth potential. The self-contained power signal generation system may further include a single-ended-to-differential signal converter configured to receive the analog reference signal and output a differential signal pair including a non-inverted reference signal corresponding to the analog reference signal, and an inverted reference signal inversely corresponding to the analog reference signal. The power signal generator may be configured as a fully differential structure, including a first summation unit configured to receive the non-inverted reference signal, to receive an inverted feedback signal, and to output a non-inverted summation signal, a second summation unit configured to receive the inverted reference signal, to receive a non-inverted feedback signal, and to output an inverted summation signal, a differential pre-amplifier configured to receive and amplify the non-inverted summation signal minus the inverted summation signal and produce a non-inverting preamp output signal and an inverted preamp output signal, a differential switching amplifier configured to receive, modulate, and amplify the non-inverted preamp output signal and the inverted preamp output signal and to output a non-inverted modulated signal and an inverted modulated signal, and a differential output and feedback driver including an H-bridge and an LC low-pass filter, and configured to receive, amplify, convert, and filter the non-inverted modulated signal and the inverted modulated signal, drive the electrical load with a non-inverted drive signal and an inverted drive signal, and produce the non-inverted feedback signal and the inverted feedback signal corresponding to a load power signal indicative of power developed in the electrical load to be controlled by the power signal generator. The differential output and feedback driver of the power signal generator may be configured to produce the non-inverted feedback signal and the inverted feedback signal corresponding to an output current signal that flows through the electrical load. The differential output and feedback driver of the power signal generator may be configured to produce the non-inverted feedback signal and the inverted feedback signal corresponding to an output voltage signal that is developed across the electrical load. The self-contained power signal generation system may further include a wind tunnel formed by one or more circuit boards including a complete set of system circuits of the self-contained power signal generation system and configured to perform cooling of heat dissipating parts, an air mover configured to move ambient air through the wind tunnel, and an air mover power source configured to energize the air mover. The self-contained power signal generation system may further include a wind tunnel formed by one or more circuit boards including a complete set of system circuits of the self-contained power signal generation system and configured to perform cooling of heat dissipating parts, a plurality of air movers, at least one of which is configured to move air into a first opening of the wind tunnel and at least one other which is configured to draw air out of an opposite opening of the wind tunnel, and an air mover power source configured to power the air mover. The control system may include an air temperature measurement configured to measure air temperature moving through the wind tunnel, and an air mover power source adjuster configured to control the air mover power source such that the air movers move more when the air temperature measurement increases, and the air movers move less when the air temperature measurement decreases. The control and monitoring module may further include a programmable logic array configured to control and/or monitor the arbitrary digital reference signal and a burden test module, a microprocessor configured to control and/or monitor a user interface, the programmable logic array, a battery charging circuit, a set of circuit power voltage rails, the air temperature measurement, the air mover power source adjuster, and programming the programmable logic array, and the wired communication interface configured to transmit bidirectional communications between the microprocessor and an external host such as a self-contained electricity metering site tester. The burden test module may include a set of burden resistances configured to add sequentially increasing burden in series with a customer load current to perform various site tests such as a CT burden added test, and a set of relays configured to route the customer load current through the self-contained power signal generation system and the set of burden resistances. The self-contained power source may be a rechargeable battery; and the system may further include a battery charging circuit configured to charge the rechargeable battery. The control system may further include a battery charge management algorithm configured to compute a predicted battery voltage drop based on present voltages, temperatures, and an output magnitude setting of the power signal generator such that the power signal generator startup is automatically disabled prior to a normal startup when the predicted battery voltage drop exceeds a predetermined voltage magnitude indicating that the normal startup of the power signal generator is substantially likely not possible. The output current signal may have a selectable output rms magnitude from substantially zero amps to approximately 50 amps or more. The output current signal may have a selectable output magnitude from substantially zero amps to between approximately 5 amps up to 50 amps or more. The output voltage signal may have a selectable output rms magnitude from substantially zero volts to approximately 600 volts or more. The output voltage signal may have a selectable output rms magnitude from substantially zero volts to between approximately 240 volts up to 600 volts or more. The burden test module may include a set of burden resistances configured to add sequentially increasing burden in series with the output current signal of the power signal generator to perform various site tests such as the CT burden added test, and a set of relays configured to route the output current signal of the power signal generator through the self-contained power signal generation system and the set of burden resistances. The self-contained power signal generation system may further include a plurality of power signal generators configured in parallel with the electrical load to increase magnitude of the output current signal by a factor substantially equal to number of the power signal generator paralleled. The self-contained power signal generation system may further include a plurality of power signal generators configured in series with the electrical load to increase magnitude of the output voltage signal by the factor substantially equal to number of the power signal generator in series. The power signal generator may further include a plurality of the differential output and feedback drivers configured in parallel with the electrical load to increase magnitude of the output current signal by the factor substantially equal to number of the differential output and feedback driver paralleled. The power signal generator may further include a plurality of digital signal isolation circuits configured between the differential switching amplifier and the plurality of the differential output and feedback drivers configured in series with the electrical load to increase magnitude of the output voltage signal by the factor substantially equal to number of the differential output and feedback driver in series. The self-contained power signal generation system may further include two additional power signal generators configured in the self-contained power signal generation system for three-phase operation via production of three load power signal outputs. The self-contained power signal generation system may further include two additional power signal generators configured in the self-contained power signal generation system for three-phase operation. The self-contained electricity metering site tester may be configured to monitor the load power signal and fed back via the wired communication interface to the self-contained power signal generation system a magnitude of the load power signal for more precise control of the load power signal. The self-contained power source may be a rechargeable battery, and the system may further include a battery charging circuit configured to charge the rechargeable battery. The digital signal isolation circuit may include a plurality of cascaded digital signal isolators. The power signal generator may be configured to output a variety of generated signals with harmonics up to approximately the 50th order.

Various example embodiments of the present general inventive concept may provide a self-contained power signal generation system including a test signal generator configured to generate a test signal, a single ended to differential converter configured to convert the test signal to a differential pair of test signals, and a signal waveform source configured to receive and condition the differential pair of test signals and output the signals to a load, wherein an input, output, and feedback are all differential.

Various example embodiments of the present general inventive concept may provide a self-contained power signal generation system including a three-phase, 5-amp current source configured to generate a meter test signal, a battery and a handheld portable case encasing the current source and battery, wherein the battery is configured to fully power the three-phase, 5-amp current source.

Various example embodiments of the present general inventive concept may provide a method of verifying accuracy of an electricity meter, the method including generating a test signal using any of the systems described herein or otherwise within the scope of the present general inventive concept, applying the test signal to an electricity meter, measuring the test signal as applied to the meter using an external power measurement device, and comparing a measured test signal from the external power measurement device to a measurement of the test signal from the meter.

Various example embodiments of the present general inventive concept may provide a test signal generation system including a digital signal generator to generate a digital test signal, a DAC to convert the digital test signal to an analog test signal, a signal converter to convert the analog test signal to a differential pair of test signals corresponding to the analog test signal, and a waveform generator including an input module to receive the differential pair of test signals, a switching amplifier to amplify and modulate the differential pair of test signals, and an output module to output a differential pair of output signals to a load, to feed back the differential pair of output signals to the input module, and to receive an amplified differential pair of signals from the switching amplifier. The test signal generation system may further include an isolated power electronics module to power the waveform generator. The waveform generator may be configured to generate a three-phase differential test signal. The test isolated power electronics module may include a battery to generate DC power, a power isolation module having a high frequency DC to DC converter for each of the three phases of signal generation. The differential pair of output signals may be a differential current signal or a differential voltage signal. The three-phase differential test signal may be selectable up to a value of approximately 5 amps. The battery may be a 12 volt lithium-ion battery. The test signal generation system may further include an isolation module to isolate the digital test signal. The isolation module may include at least a pair of cascaded digital signal isolators. The waveform generator may be configured to output a variety of generated signals with harmonics up to the 50th order.

Various example embodiments of the present general inventive concept may provide a test signal generation system including a test signal generator to generate a test signal, a single ended to differential converter to convert the test signal to a differential pair of test signals, and a signal waveform source configured to receive and condition the differential pair of test signals and output the signals to a load, wherein an input, output, and feedback are all differential.

Various example embodiments of the present general inventive concept may provide a test signal generation system, including a three-phase, 5-amp current source to generate a meter test signal, a battery, and a handheld portable case encasing the current source and battery, wherein the battery is configured to fully power the three-phase, 5-amp current source.

Various example embodiments of the present general inventive concept may provide a method of verifying accuracy of an electricity meter, the method including generating a test signal using a general system such as those discussed herein or otherwise according to the present general inventive concept, applying the test signal to an electricity meter, measuring the test signal as applied to the meter using an external power measurement device, and comparing a measured test signal from the external power measurement device to a measurement of the test signal from the meter.

It is noted that the simplified diagrams and drawings do not illustrate all the various connections and assemblies of the various components, however, those skilled in the art will understand how to implement such connections and assemblies, based on the illustrated components, figures, and descriptions provided herein, using sound engineering judgment.

Numerous variations, modifications, and additional embodiments are possible, and accordingly, all such variations, modifications, and embodiments are to be regarded as being within the spirit and scope of the present general inventive concept. For example, regardless of the content of any portion of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated.

While the present general inventive concept has been illustrated by description of several example embodiments, and while the illustrative embodiments have been described in detail, it is not the intention of the applicant to restrict or in any way limit the scope of the general inventive concept to such descriptions and illustrations. Instead, the descriptions, drawings, and claims herein are to be regarded as illustrative in nature, and not as restrictive, and additional embodiments will readily appear to those skilled in the art upon reading the above description and drawings. Additional modifications will readily appear to those skilled in the art. Accordingly, departures may be made from such details without departing from the spirit or scope of applicant's general inventive concept.

The invention claimed is:

1. A self-contained power signal generation system, comprising:
   a self-contained power source configured to provide electrical operating power to the self-contained power signal generation system, the self-contained power source being a rechargeable battery;
   a power signal generator configured to generate an output test signal corresponding to an input reference signal
   a self-contained reference signal source configured to generate the input reference signal
   a battery charging circuit configured to charge the rechargeable battery; and
   a battery charge management algorithm configured to compute a predicted battery voltage drop based on present voltages, temperatures, and an output magnitude setting of the power signal generator such that the power signal generator startup is automatically disabled prior to a normal startup when the predicted battery voltage drop exceeds a predetermined voltage magnitude indicating that the normal startup of the power signal generator is not possible.

2. The self-contained power signal generation system of claim 1, further comprising a control system configured to operate the self-contained power signal generation system.

3. The self-contained power signal generation system of claim 2, wherein the control system is configured as a control and monitoring module including a wired communication interface.

4. The self-contained power signal generation system of claim 2, wherein the control system is configured as a control and monitoring module including a wireless communication interface.

5. The self-contained power signal generation system of claim 2, wherein the self-contained reference signal source comprises:
   a digital-to-analog converter configured to receive an arbitrary digital reference signal produced by the control system, and to produce an analog reference signal corresponding to the arbitrary digital reference signal.

6. The self-contained power signal generation system of claim 5, further comprising:
   a digital signal isolation circuit configured to isolate the digital-to-analog converter from ground potential of the control system which produces the arbitrary digital reference signal received by the digital-to-analog converter; and
   an isolated power electronics module configured to supply isolated power to the power signal generator and to isolate the power signal generator from earth potential.

7. The self-contained power signal generation system of claim 6, further comprising:
   a single-ended-to-differential signal converter configured to receive the analog reference signal and output a differential signal pair comprising:
      a non-inverted reference signal corresponding to the analog reference signal, and
      an inverted reference signal inversely corresponding to the analog reference signal.

8. The self-contained power signal generation system of claim 7, wherein the power signal generator is configured as a fully differential structure, comprising:
- a first summation unit configured to receive the non-inverted reference signal, to receive an inverted feedback signal, and to output a non-inverted summation signal;
- a second summation unit configured to receive the inverted reference signal, to receive a non-inverted feedback signal, and to output an inverted summation signal;
- a differential pre-amplifier configured to receive and amplify the non-inverted summation signal minus the inverted summation signal and produce a non-inverting preamp output signal and an inverted preamp output signal;
- a differential switching amplifier configured to receive, modulate, and amplify the non-inverted preamp output signal and the inverted preamp output signal and to output a non-inverted modulated signal and an inverted modulated signal; and
- a differential output and feedback driver including an H-bridge and an LC low-pass filter, and configured to receive, amplify, convert, and filter the non-inverted modulated signal and the inverted modulated signal, drive the electrical load with a non-inverted drive signal and an inverted drive signal, and produce the non-inverted feedback signal and the inverted feedback signal corresponding to a load power signal indicative of power developed in the electrical load to be controlled by the power signal generator.

9. The self-contained power signal generation system of claim 8, wherein the differential output and feedback driver of the power signal generator is configured to produce the non-inverted feedback signal and the inverted feedback signal corresponding to an output current signal that flows through the electrical load.

10. The self-contained power signal generation system of claim 8, wherein the differential output and feedback driver of the power signal generator is configured to produce the non-inverted feedback signal and the inverted feedback signal corresponding to an output voltage signal that is developed across the electrical load.

11. The self-contained power signal generation system of claim 1, further comprising:
- a wind tunnel formed by one or more circuit boards including a complete set of system circuits of the self-contained power signal generation system and configured to perform cooling of heat dissipating parts;
- an air mover configured to move ambient air through the wind tunnel; and
- an air mover power source configured to energize the air mover.

12. The self-contained power signal generation system of claim 2, further comprising:
- a wind tunnel formed by one or more circuit boards including a complete set of system circuits of the self-contained power signal generation system and configured to perform cooling of heat dissipating parts;
- a plurality of air movers, at least one of which is configured to move air into a first opening of the wind tunnel and at least one other which is configured to draw air out of an opposite opening of the wind tunnel; and
- an air mover power source configured to power the air mover.

13. The self-contained power signal generation system of claim 12, wherein the control system comprises:
- an air temperature measurement configured to measure air temperature moving through the wind tunnel; and
- an air mover power source adjuster configured to control the air mover power source such that the air movers move more when the air temperature measurement increases, and the air movers move less when the air temperature measurement decreases.

14. The self-contained power signal generation system of claim 3, wherein the wired communication interface is configured to transmit bidirectional communications between a microprocessor and an external host.

15. The self-contained power signal generation system of claim 1, further comprising a burden test module, wherein the burden test module comprises:
- a set of burden resistances configured to add sequentially increasing burden in series with a customer load current to perform various site tests such as a current transformer (CT) burden added test; and
- a set of relays configured to route the customer load current through the self-contained power signal generation system and the set of burden resistances.

16. The self-contained power signal generation system of claim 9, wherein the output current signal has a selectable output rms magnitude from substantially zero amps to approximately 50 amps or more.

17. The self-contained power signal generation system of claim 10, wherein the output voltage signal has a selectable output rms magnitude from substantially zero volts to approximately 600 volts or more.

18. The self-contained power signal generation system of claim 15, wherein the burden test module comprises:
- a set of burden resistances configured to add sequentially increasing burden in series with the output current signal of the power signal generator to perform various site tests such as the CT burden added test; and
- a set of relays configured to route the output current signal of the power signal generator through the self-contained power signal generation system and the set of burden resistances.

19. The self-contained power signal generation system of claim 9, further comprising a plurality of power signal generators configured in parallel with the electrical load to increase magnitude of the output current signal by a factor substantially equal to number of the power signal generator paralleled.

20. The self-contained power signal generation system of claim 10, further comprising a plurality of power signal generators configured in series with the electrical load to increase magnitude of the output voltage signal by the factor substantially equal to number of the power signal generator in series.

21. The self-contained power signal generation system of claim 9, wherein the power signal generator further comprises a plurality of the differential output and feedback drivers configured in parallel with the electrical load to increase magnitude of the output current signal by the factor substantially equal to number of the differential output and feedback driver paralleled.

22. The self-contained power signal generation system of claim 10, wherein the power signal generator further comprises a plurality of digital signal isolation circuits configured between the differential switching amplifier and the plurality of the differential output and feedback drivers configured in series with the electrical load to increase magnitude of the output voltage signal by the factor substantially equal to number of the differential output and feedback driver in series.

23. The self-contained power signal generation system of claim 8, further comprising two additional power signal generators configured in the self-contained power signal generation system for three-phase operation via production of three load power signal outputs.

24. The self-contained power signal generation system of claim 1, further comprising two additional power signal generators configured in the self-contained power signal generation system for three-phase operation.

25. The self-contained power signal generation system of claim 2, further comprising two additional power signal generators configured in the self-contained power signal generation system for three-phase operation.

26. The self-contained power signal generation system of claim 14, wherein the external host is configured to monitor a load power signal fed back via the wired communication interface to the self-contained power signal generation system as a magnitude of the load power signal for more precise control of the load power signal.

27. The self-contained power signal generation system of claim 6, wherein the digital signal isolation circuit comprises a plurality of cascaded digital signal isolators.

28. The self-contained power signal generation system of claim 8, wherein the power signal generator is configured to output a variety of generated signals with harmonics up to approximately the 50th order.

29. A method of verifying accuracy of an electricity meter, the method comprising:
generating a test signal using the system of claim 1;
applying the test signal to an electricity meter;
measuring the test signal as applied to the meter using an external power measurement device; and
comparing a measured test signal from the external power measurement device to a measurement of the test signal from the meter.

30. A self-contained, portable power signal generation system configured to measure accuracy of an electrical meter, the power generation system comprising:
a power signal generator configured to generate a test signal;
one or more connectors configured to apply the test signal to an electrical meter; and
a testing unit configured to measure power applied to the meter to determine an amount of power applied to the electrical meter from the test signal, and to compare the amount of power applied to the electrical meter from the test signal to a power reading of the electrical meter to determine a difference between the amount of power applied to the meter and the power reading of the electrical meter.

31. The self-contained, portable power signal generation system of claim 30, wherein the power signal generator is battery operated.

32. The self-contained, portable power signal generation system of claim 30, wherein the power signal generator is configured to be lightweight so as to be carried by a single operator.

33. The self-contained, portable power signal generation system of claim 30, further comprising a handheld portable case configured to encase the power signal generator and a battery to operate the power signal generator.

34. The self-contained, portable power signal generation system of claim 30, wherein the power signal generator comprises a battery configured to fully power a three-phase, 5-amp current source.

35. The self-contained, portable power signal generation system of claim 34, wherein the battery is a rechargeable battery.

36. The self-contained, portable power signal generation system of claim 35, further comprising a battery charging circuit configured to charge the rechargeable battery.

37. A self-contained power signal generation system, comprising:
a self-contained power source configured to provide electrical operating power to the self-contained power signal generation system;
a power signal generator configured to generate an output test signal corresponding to an input reference signal;
a self-contained reference signal source configured to generate the input reference signal; and
a burden test module comprising:
a set of burden resistances configured to add sequentially increasing burden in series with a customer load current to perform various site tests such as a current transformer (CT) burden added test, and
a set of relays configured to route the customer load current through the self-contained power signal generation system and the set of burden resistances.

38. The self-contained power signal generation system of claim 37, further comprising a control system configured to operate the self-contained power signal generation system.

39. The self-contained power signal generation system of claim 38, wherein the control system is configured as a control and monitoring module including a wired communication interface.

40. The self-contained power signal generation system of claim 39, wherein the wired communication interface is configured to transmit bidirectional communications between a microprocessor and an external host.

41. The self-contained power signal generation system of claim 40, wherein the external host is configured to monitor a load power signal fed back via the wired communication interface to the self-contained power signal generation system as a magnitude of the load power signal for more precise control of the load power signal.

42. The self-contained power signal generation system of claim 38, wherein the control system is configured as a control and monitoring module including a wireless communication interface.

43. The self-contained power signal generation system of claim 38, wherein the self-contained reference signal source comprises:
a digital-to-analog converter configured to receive an arbitrary digital reference signal produced by the control system, and to produce an analog reference signal corresponding to the arbitrary digital reference signal.

44. The self-contained power signal generation system of claim 43, further comprising:
a digital signal isolation circuit configured to isolate the digital-to-analog converter from ground potential of the control system which produces the arbitrary digital reference signal received by the digital-to-analog converter; and
an isolated power electronics module configured to supply isolated power to the power signal generator and to isolate the power signal generator from earth potential.

45. The self-contained power signal generation system of claim 44, wherein the digital signal isolation circuit comprises a plurality of cascaded digital signal isolators.

46. The self-contained power signal generation system of claim 44, further comprising:

a single-ended-to-differential signal converter configured to receive the analog reference signal and output a differential signal pair comprising:
  a non-inverted reference signal corresponding to the analog reference signal, and
  an inverted reference signal inversely corresponding to the analog reference signal.

47. The self-contained power signal generation system of claim 46, wherein the power signal generator is configured as a fully differential structure, comprising:
  a first summation unit configured to receive the non-inverted reference signal, to receive an inverted feedback signal, and to output a non-inverted summation signal;
  a second summation unit configured to receive the inverted reference signal, to receive a non-inverted feedback signal, and to output an inverted summation signal;
  a differential pre-amplifier configured to receive and amplify the non-inverted summation signal minus the inverted summation signal and produce a non-inverting preamp output signal and an inverted preamp output signal;
  a differential switching amplifier configured to receive, modulate, and amplify the non-inverted preamp output signal and the inverted preamp output signal and to output a non-inverted modulated signal and an inverted modulated signal; and
  a differential output and feedback driver including an H-bridge and an LC low-pass filter, and configured to receive, amplify, convert, and filter the non-inverted modulated signal and the inverted modulated signal, drive the electrical load with a non-inverted drive signal and an inverted drive signal, and produce the non-inverted feedback signal and the inverted feedback signal corresponding to a load power signal indicative of power developed in the electrical load to be controlled by the power signal generator.

48. The self-contained power signal generation system of claim 47, wherein the differential output and feedback driver of the power signal generator is configured to produce the non-inverted feedback signal and the inverted feedback signal corresponding to an output current signal that flows through the electrical load.

49. The self-contained power signal generation system of claim 48, wherein the output current signal has a selectable output rms magnitude from substantially zero amps to approximately 50 amps or more.

50. The self-contained power signal generation system of claim 48, further comprising a plurality of power signal generators configured in parallel with the electrical load to increase magnitude of the output current signal by a factor substantially equal to number of the power signal generator paralleled.

51. The self-contained power signal generation system of claim 48, wherein the power signal generator further comprises a plurality of the differential output and feedback drivers configured in parallel with the electrical load to increase magnitude of the output current signal by the factor substantially equal to number of the differential output and feedback driver paralleled.

52. The self-contained power signal generation system of claim 47, wherein the differential output and feedback driver of the power signal generator is configured to produce the non-inverted feedback signal and the inverted feedback signal corresponding to an output voltage signal that is developed across the electrical load.

53. The self-contained power signal generation system of claim 52, wherein the output voltage signal has a selectable output rms magnitude from substantially zero volts to approximately 600 volts or more.

54. The self-contained power signal generation system of claim 52, further comprising a plurality of power signal generators configured in series with the electrical load to increase magnitude of the output voltage signal by the factor substantially equal to number of the power signal generator in series.

55. The self-contained power signal generation system of claim 52, wherein the power signal generator further comprises a plurality of digital signal isolation circuits configured between the differential switching amplifier and the plurality of the differential output and feedback drivers configured in series with the electrical load to increase magnitude of the output voltage signal by the factor substantially equal to number of the differential output and feedback driver in series.

56. The self-contained power signal generation system of claim 47, further comprising two additional power signal generators configured in the self-contained power signal generation system for three-phase operation via production of three load power signal outputs.

57. The self-contained power signal generation system of claim 47, wherein the power signal generator is configured to output a variety of generated signals with harmonics up to approximately the 50th order.

58. The self-contained power signal generation system of claim 38, further comprising:
  a wind tunnel formed by one or more circuit boards including a complete set of system circuits of the self-contained power signal generation system and configured to perform cooling of heat dissipating parts;
  a plurality of air movers, at least one of which is configured to move air into a first opening of the wind tunnel and at least one other which is configured to draw air out of an opposite opening of the wind tunnel; and
  an air mover power source configured to power the air mover.

59. The self-contained power signal generation system of claim 58, wherein the control system comprises:
  an air temperature measurement configured to measure air temperature moving through the wind tunnel; and
  an air mover power source adjuster configured to control the air mover power source such that the air movers move more when the air temperature measurement increases, and the air movers move less when the air temperature measurement decreases.

60. The self-contained power signal generation system of claim 38, further comprising two additional power signal generators configured in the self-contained power signal generation system for three-phase operation.

61. The self-contained power signal generation system of claim 38, wherein the self-contained power source is a rechargeable battery, and further comprising:
  a battery charging circuit configured to charge the rechargeable battery.

62. The self-contained power signal generation system of claim 38, wherein the self-contained power source is a battery.

63. The self-contained power signal generation system of claim 62, wherein the self-contained power source is a rechargeable battery; and further comprising:
  a battery charging circuit configured to charge the rechargeable battery.

64. The self-contained power signal generation system of claim 63, wherein the control system further comprises:
 a battery charge management algorithm configured to compute a predicted battery voltage drop based on present voltages, temperatures, and an output magnitude setting of the power signal generator such that the power signal generator startup is automatically disabled prior to a normal startup when the predicted battery voltage drop exceeds a predetermined voltage magnitude indicating that the normal startup of the power signal generator is not possible.

65. The self-contained power signal generation system of claim 37, further comprising:
 a wind tunnel formed by one or more circuit boards including a complete set of system circuits of the self-contained power signal generation system and configured to perform cooling of heat dissipating parts;
 an air mover configured to move ambient air through the wind tunnel; and
 an air mover power source configured to energize the air mover.

66. The self-contained power signal generation system of claim 37, wherein the burden test module comprises:
 a set of burden resistances configured to add sequentially increasing burden in series with the output current signal of the power signal generator to perform various site tests such as the CT burden added test; and
 a set of relays configured to route the output current signal of the power signal generator through the self-contained power signal generation system and the set of burden resistances.

67. The self-contained power signal generation system of claim 37, further comprising two additional power signal generators configured in the self-contained power signal generation system for three-phase operation.

68. A method of verifying accuracy of an electricity meter, the method comprising:
 generating a test signal using the system of claim 37;
 applying the test signal to an electricity meter;
 measuring the test signal as applied to the meter using an external power measurement device; and
 comparing a measured test signal from the external power measurement device to a measurement of the test signal from the meter.

* * * * *